United States Patent
Steely, Jr. et al.

(10) Patent No.: US 10,963,022 B2
(45) Date of Patent: *Mar. 30, 2021

(54) LAYERED SUPER-RETICLE COMPUTING : ARCHITECTURES AND METHODS

(71) Applicant: Intel Corporation, Santa Clara, CA (US)

(72) Inventors: Simon C. Steely, Jr., Hudson, NH (US); Richard Dischler, Bolton, MA (US); David Bach, Shrewsbury, MA (US); Olivier Franza, Brookline, MA (US); William J. Butera, Newton, MA (US); Christian Karl, Hudson, MA (US); Benjamin Keen, Minneapolis, MN (US); Brian Leung, Quincy, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/862,263

(22) Filed: Apr. 29, 2020

(65) Prior Publication Data

US 2020/0371566 A1    Nov. 26, 2020

Related U.S. Application Data

(63) Continuation of application No. 16/416,753, filed on May 20, 2019, now Pat. No. 10,691,182.

(51) Int. Cl.
*H05K 1/18*     (2006.01)
*G06F 1/18*     (2006.01)
(Continued)

(52) U.S. Cl.
CPC ............ *G06F 1/183* (2013.01); *G06F 9/5027* (2013.01); *G06F 15/76* (2013.01);
(Continued)

(58) Field of Classification Search
USPC ....................................................... 361/764
See application file for complete search history.

(56) References Cited

U.S. PATENT DOCUMENTS

| | | |
|---|---|---|
| 2014/0049932 A1 | 2/2014 | Camarota |
| 2016/0334991 A1 | 11/2016 | Berger et al. |
| 2018/0076156 A1 | 3/2018 | Kim et al. |

FOREIGN PATENT DOCUMENTS

| | | |
|---|---|---|
| KR | 2018 0015523 A | 2/2018 |
| WO | WO2011/107612 A1 | 9/2011 |

OTHER PUBLICATIONS

Michael Felman "DARPA Picks Research Teams for Post-Moore's Law Work", Aug. 1, 2018, 8 pages [retreived on Aug. 26, 2019]. Retrieved from the Internet<http://www.top500.org/news/darpa-picks-research-teams-for-post-moores-law-work/>.

(Continued)

*Primary Examiner* — Andargie M Aychillhum
(74) *Attorney, Agent, or Firm* — Schwabe, Williamson & Wyatt, P.C.

(57) ABSTRACT

Embodiments herein may present an integrated circuit or a computing system having an integrated circuit, where the integrated circuit includes a physical network layer, a physical computing layer, and a physical memory layer, each having a set of dies, and a die including multiple tiles. The physical network layer further includes one or more signal pathways dynamically configurable between multiple pre-defined interconnect topologies for the multiple tiles, where each topology of the multiple pre-defined interconnect topologies corresponds to a communication pattern related to a workload. At least a tile in the physical computing layer is further arranged to move data to another tile in the physical computing layer or a storage cell of the physical memory layer through the one or more signal pathways in the physical network layer. Other embodiments may be described and/or claimed.

25 Claims, 12 Drawing Sheets

(51) Int. Cl.
    *H01L 23/538*     (2006.01)
    *G06F 9/50*     (2006.01)
    *G06F 15/76*     (2006.01)
    *H01L 25/065*     (2006.01)

(52) U.S. Cl.
    CPC ...... *H01L 23/5384* (2013.01); *H01L 23/5385* (2013.01); *H01L 23/5386* (2013.01); *H01L 25/0657* (2013.01)

(56) References Cited

OTHER PUBLICATIONS

Yen-Po Chen et al., "An Injectable 64 nW ECG Mixed-Signal SoC in 65 nm for Arrhythmia Monitoring", Jan. 1, 2015, 16 pages, IEEE Journal of Solid-State Circuirts, vol. 50, No. 1.

Gregroy Chen et al., "A 340 mV-to-0.9 V 20.2 Tb/s Source-Synchronous Hybrid Packet/Circuit-Switched 15×16 Network-on-Chip in 22 nm Tri-Gate CMOS", Jan. 2015, 9 pages, IEEE Journal of Solid-State Circuits, vol. 50, No. 1.

Saptadeep Pal et al., "Architecting Waferscale Processors—A GPU Case Study", Feb. 2019, 14 pages.

Sivachandra Jangam et al., "Latency, Bandwidth and Power Benefits of the SuperCHIPS Integration Scheme", 2017, 9 pages, 2017 IEEE 67th Electronic Components and Technology Conference.

Subramanian S. Iyer "Heterogeneous Integration using the Silicon Interconnect Fabric", 2018, 3 pages, 2018 IEEE Electronic Devices Technology and Manufacturing Conference Proceedings of Technical Papers.

Extended European Search Report dated Sep. 7, 2020 for European Patent Application No. 20166445.5, 7 pages.

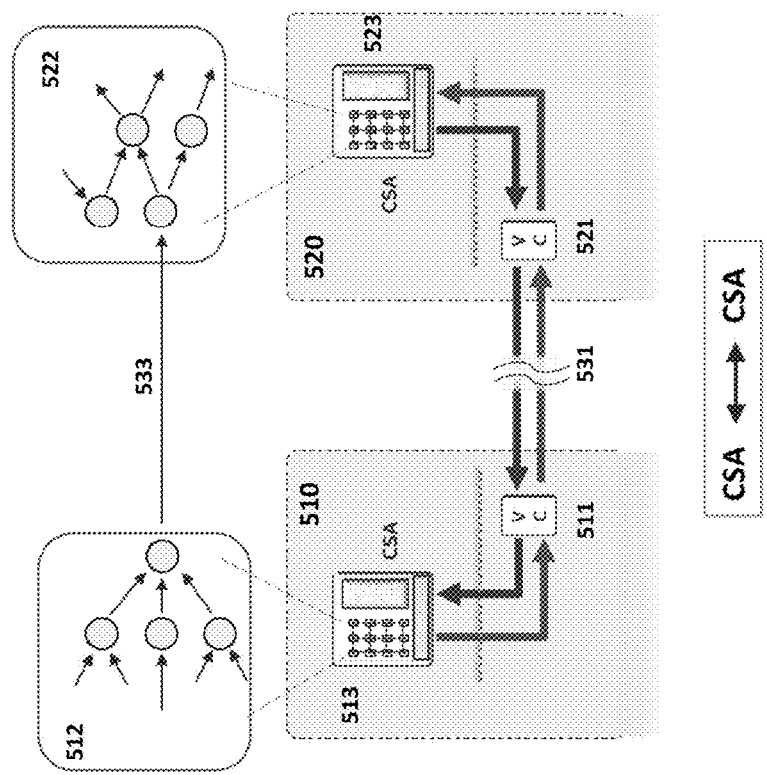
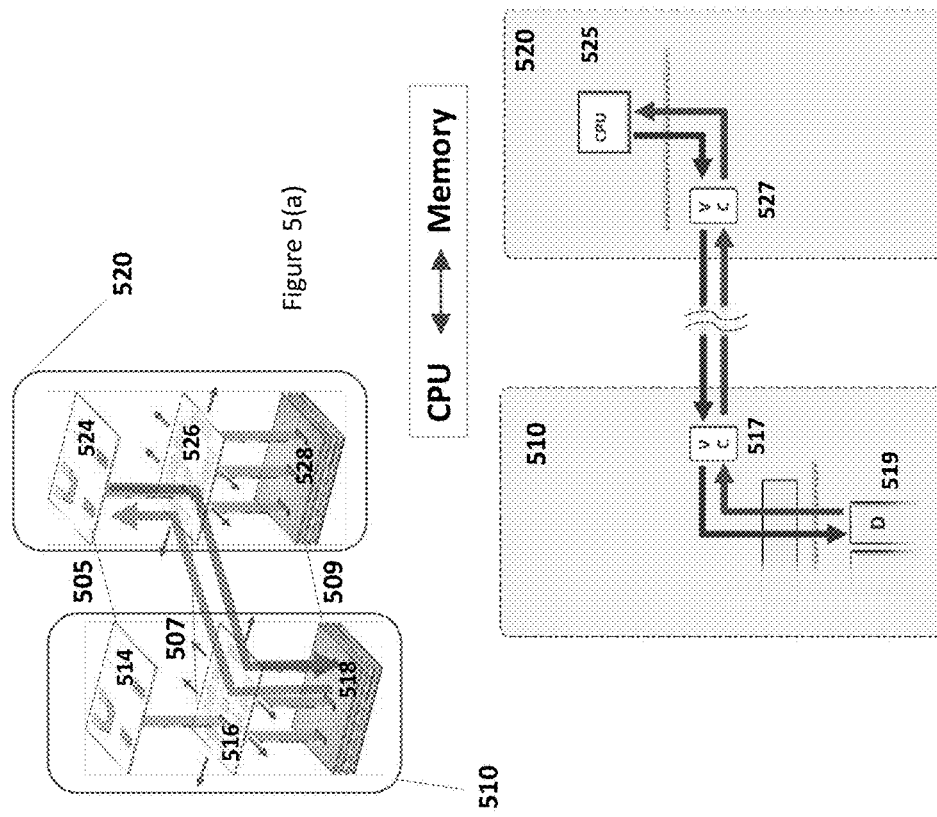
Figure 5(a)
Figure 5(b)
Figure 5(c)

LAYERED SUPER-RETICLE COMPUTING : ARCHITECTURES AND METHODS

RELATED APPLICATIONS

This application is a continuation of U.S. application Ser. No. 16/416,753, filed May 20, 2019, entitled "LAYERED SUPER-RETICLE COMPUTING : ARCHITECTURES AND METHODS", and claims priority to the Ser. No. 16/416,753 application. The contents of the Ser. No. 16/416,753 application is hereby incorporated by reference herein in its entirety for all purposes.

This invention was made with Government support under Agreement No. H98230A-13-D-0124-08 awarded by the Department of Defense. The Government has certain rights in this invention.

FIELD

Embodiments of the present disclosure relate generally to the technical field of computing, and more particularly to integrated circuits with multiple physical layers.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Traditionally, high performance computing (HPC) and enterprise data center computing are optimized for different types of applications. Those within the data center are largely transaction-oriented while HPC applications crunch numbers and high volumes of data. However, driven by business-oriented analytics applications, e.g., Artificial intelligence (AI), HPC plays a more and more important role in data center computing. HPC systems have made tremendous progress, but still face many obstacles to further improve their performance. For example, the throughput per unit area and energy efficiency of integrated circuits (ICs) in current HPC systems may be limited. HPC systems may be built using multi-tile processor ICs that may include multiple processor tiles. A processor tile may include a computing element, a processor core, a core, a processing engine, an execution unit, a central processing unit (CPU), caches, switches, and other components. A large number of processor tiles may be formed on a die. Efforts to advance the performance of HPC system ICs may have focused largely on advancing performance of component parts while holding the division of labor for a workload between the components relatively stable. Incremental advances in component performance are ultimately bounded.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 5(a)-5(c) illustrate more details of dataflow computations by multiple tile stacks of an exemplary computing IC, in accordance with various embodiments.

DETAILED DESCRIPTION

Figure 1A:
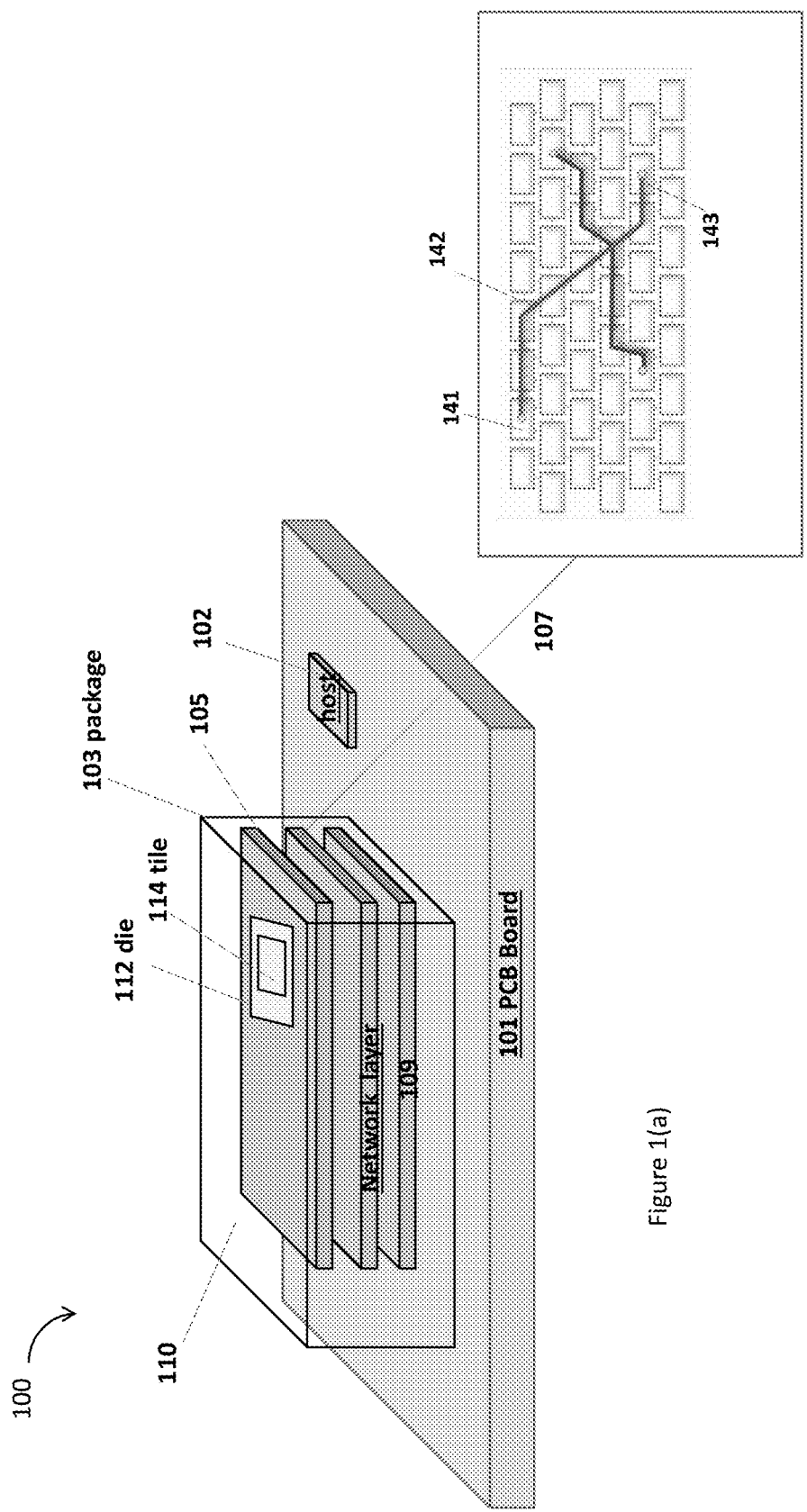
FIGS. 1(a)-1(c) illustrate an exemplary computing system including a computing integrated circuit (IC) formed with multiple physical layers that include multiple dies and tiles, in accordance with various embodiments.
Figure 1:
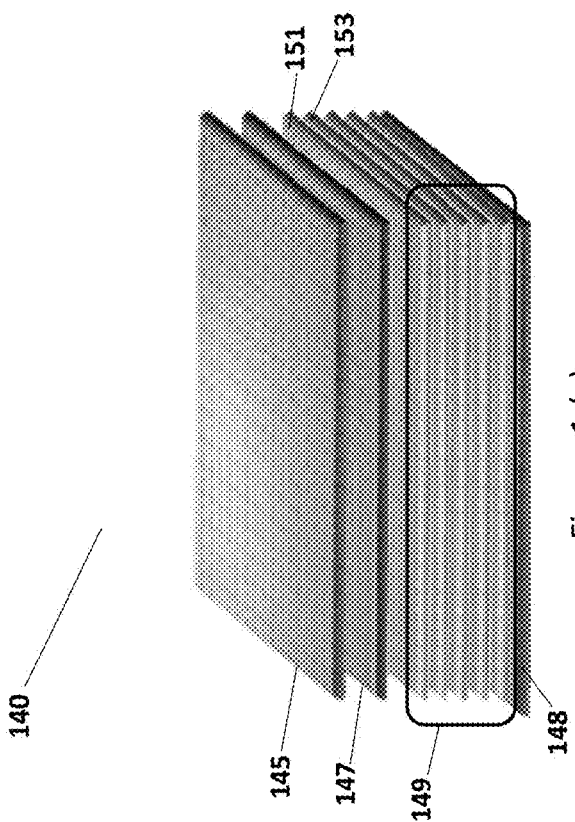
Figure 1:
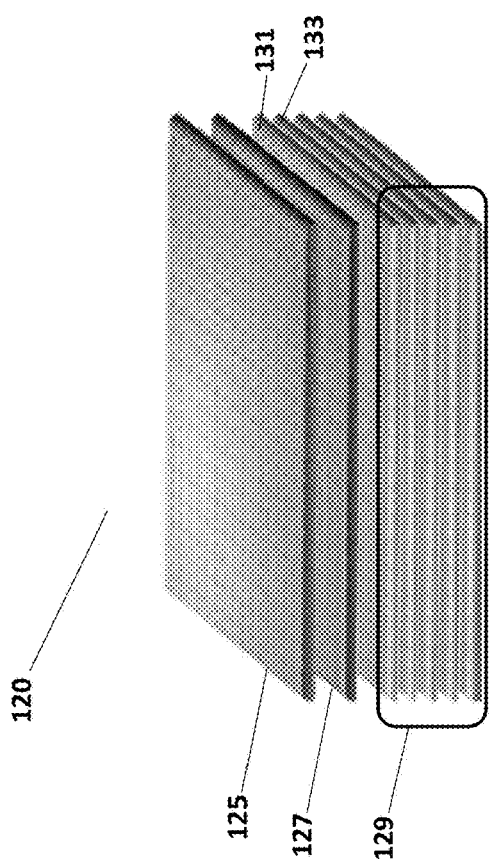

Enterprise data center computing are facing many new challenges for data-driven, customer-facing online services, including financial services, healthcare, and travel. The explosive, global growth of software as a service and online services is leading to major changes in enterprise infrastructure, with new application development methodologies, new database solutions, new infrastructure hardware and software technologies, and new datacenter management paradigms. As enterprise cloud infrastructures continue to grow in scale while delivering increasingly sophisticated analytics, High performance computing (HPC) systems may play a more and more important role in the data driven enterprise cloud computing.

High performance computing (HPC) systems may be built using multi-tile processors, e.g. integrated circuits (ICs) with multiple processor tiles, or simply referred to as tiles. A processor tile may include a computing element, a processor core, a core, a processing engine, an execution unit, a central processing unit (CPU), caches, switches, and other components. A large number of processor tiles may be formed on a die. Each tile may be coupled to one or more neighboring tiles by interconnects according to a topology or an interconnect topology.

Efforts to advance the performance of HPC systems have focused largely on advancing performance of component parts of HPC systems while holding the division of labor for a workload between the components relatively stable. For example, various technologies have been developed for higher performance sockets, higher bandwidth switching fabric, denser packaging, higher capacity cooling, faster and denser tile arrays, higher bandwidth on-die mesh, more efficient on-package routing, larger or faster memory stacks, or 3D logic stacking and near-memory compute. Incremental advances in component performance are ultimately bounded by the architectural fundamentals at the socket and board levels. For example, there may be a minimum energy cost to move a byte of data from a high bandwidth memory (HBM), e.g., DRAM stack, onto the tile array, through the memory hierarchy and on to the requesting core. Universal mesh-based interconnects may limit the aggregate injection rate of the tile array, and by extension, the number of tiles. For GHz clock rates, thermals may limit the number of transistors per $mm^2$ that can switch simultaneously.

Embodiments herein may address two primary limits on the performance of HPC systems: energy efficiency and throughput per unit area of the computing ICs. Embodiments herein present three dimensional dataflow computing ICs, which are an architecture including multiple physical layers, e.g., a physical network layer, a physical computing layer, and a physical memory layer. Other physical layers or device layers may be included as well, e.g., a power delivery layer, an input/output (I/O) layer, or a communication layer. The physical network layer may be above the physical memory layer, and the physical computing layer may be above the physical network layer, hence forming a three dimensional dataflow computing device. The terms, a physical network layer, a physical computing layer, or a physical memory layer refer to the fact that the physical network layer, the physical memory layer, and the physical computing layer are concrete objects in the real world, not an abstract layer just in a person's mind. For example, the physical network layer includes a first set of dies, the physical computing layer includes a second set of dies, and the physical memory layer includes a third set of dies, which are all physical objects made from silicon or other technologies. On the other hand, circuits in dies on the physical network layer may perform similar functions, e.g., related to networking functions. Similarly, circuits in dies on the physical computing layer may perform mainly computing related functions, and circuits in dies on the physical memory layer may perform mainly memory related functions, e.g., storage cells. Therefore, each of the physical network layer, the physical memory layer, and the physical computing layer may also refer to a functional layer performing similar functions. In addition, in the description below, for simplicity reasons, a physical network layer, a physical memory layer, or a physical computing layer may be simply referred to as a network layer, a memory layer, or a computing layer.

Embodiments herein may improve and overcome some technical obstacles that collectively bound performance of HPC systems, e.g., throughput per unit area and energy efficiency of the constituent computing ICs. The energy barrier may be overcome by shortening the distance from storage to a computing element, and from a computing element to another computing element, e.g., within a package. The performance barrier may be overcome with a packaging approach that includes the entire computing device with multiple physical layers within one package. Hence, the IC architecture may be viewed as an architecture for a super-reticle computer, where the super-reticle refers to the fact that multiple dies in a physical layer may be grouped together to form a super-reticle with an area size larger than a single die. The multiple dies in a physical layer, e.g., the network layer, may form a super-reticle to expand the two dimensional surface area to fill the available surface area of the U-card. In some embodiments, a super-reticle formed by multiple dies may be used for other physical layers, e.g., the computing layer. In some other embodiments, there may be only one physical layer, e.g., the network layer, includes a super-reticle. As a result, computing is performed essentially at per-board level, e.g., compute-per-1U-server. The integration of thousands of low power cores, integrated memory, and a mesh network effectively compresses many racks of standard server hardware down to a single server tray. A customer immediately saves floor space and power while achieving high and repeatable performance. For example, a customer may achieve an improvement of 6× in throughput per 1U server and 15× in performance-per-Watt over a baseline performance modeled on the evolving A21/A23 supercomputers. Additionally, multiples of these three-dimensional dataflow computing ICs with multiple physical layers can create supercomputer-grade systems with far less assembly and management hassle. In addition, the dataflow computation based design enables basic advances in run-time repeatability, precision performance modeling, and sensitivity to manufacturing yield. Embodiments herein may be used to perform some computation intensive operations such as matrix multiplications. They can be used as an accelerator to work with a host, or independently for various applications, such as the current applications for enterprise data center computing for data-driven, customer-facing online services, including financial services, healthcare, travel, and more.

Embodiments herein may present an integrated circuit including a physical network layer, a physical computing layer, and a physical memory layer. The physical network layer includes a first set of dies, and has a first side and a second side opposite to the first side. A die of the first set of dies includes multiple tiles. The physical network layer further includes one or more signal pathways dynamically configurable between multiple pre-defined interconnect topologies for the multiple tiles, where each topology of the multiple pre-defined interconnect topologies corresponds to a communication pattern related to a workload. The physical computing layer has a second set of dies. At least a die of the second set of dies includes multiple tiles, and is adjacent to the first side of the physical network layer. The physical memory layer has a third set of dies. At least a die of the third set of dies includes multiple tiles, and is adjacent to the second side of the physical network layer. A tile of the memory layer includes one or more storage cells. At least one tile in the physical computing layer is further arranged to move data to another tile in the physical computing layer or a storage cell of the physical memory layer through the one or more signal pathways in the physical network layer.

Embodiments herein may present a computing system including a printed circuit board (PCB), a host attached to the PCB, and a semiconductor package including an integrated circuit. The integrated circuit includes a physical network layer, a physical computing layer, and a physical memory layer. The host and the semiconductor package including the integrated circuit are placed on the PCB, while the physical memory layer of the integrated circuit is closer to a top surface of the PCB than the physical computing layer of the integrated circuit. The physical network layer includes a first set of dies, and has a first side and a second side opposite to the first side. A die of the first set of dies includes multiple tiles. The physical network layer further includes one or more signal pathways dynamically configurable between multiple pre-defined interconnect topologies for the multiple tiles, where each topology of the multiple pre-defined interconnect topologies corresponds to a communication pattern related to a workload. The physical computing layer has a second set of dies. At least a die of the second set of dies includes multiple tiles, and is adjacent to the first side of the physical network layer. The physical memory layer has a third set of dies. At least a die of the third set of dies includes multiple tiles, and is adjacent to the second side of the physical network layer. A tile of the memory layer includes one or more storage cells. At least a tile in the physical computing layer is further arranged to move data to another tile in the physical computing layer or a storage cell of the physical memory layer through the one or more signal pathways in the physical network layer.

Embodiments herein may present an integrated circuit including one or more tile stacks. A tile stack of the one or more tile stacks includes a computing tile in a physical computing layer, a network tile in a physical network layer, a tile of a control sublayer of a physical memory layer, and one or more storage tiles of one or more storage sublayers of the physical memory layer. The computing tile, the network tile, the tile of a control sublayer, and the one or more storage tiles are substantially vertically aligned. The computing tile includes an input/output (I/O) interface, a memory interface, a scratch memory, interconnects, and at least a computing element selected from a processor core, a configurable spatial array (CSA), an application specific integrated circuit (ASIC), a central processing unit (CPU), a processing engine (PE), a dataflow fabric. The network tile includes a virtual circuit (VC) portal to form a segment of a virtual circuit for a single-hop circuit-switched network to support circuit-switching. The one or more storage tiles include multiple storage cells.

In the description to follow, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Operations of various methods may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiments. Various additional operations may be performed and/or described operations may be omitted, split or combined in additional embodiments.

For the purposes of the present disclosure, the phrase "A or B" and "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used hereinafter, including the claims, the term "module" or "routine" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

The terms "coupled with" and "coupled to" and the like may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. By way of example and not limitation, "coupled" may mean two or more elements or devices are coupled by electrical connections on a printed circuit board such as a motherboard, for example. By way of example and not limitation, "coupled" may mean two or more elements/devices cooperate and/or interact through one or more network linkages such as wired and/or wireless networks. By way of example and not limitation, a computing apparatus may include two or more computing devices "coupled" on a motherboard or by one or more network linkages.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

FIGS. 1(a)-1(c) illustrate an exemplary computing system 100 including a computing IC 110, a computing IC 120, or a computing IC 140, formed with multiple physical layers that include multiple dies and tiles, in accordance with various embodiments.

In embodiments, the computing system 100 includes the computing IC 110, which is included in a semiconductor package 103. The semiconductor package 103 is placed on a board, e.g., a printed circuit board (PCB), 101. The board 101 may include a host or a controller 102, so that the controller 102 and the computing IC 110 may work together to accomplishing desired functions. For example, the controller 102 may perform control related operations while the computing device 110 may perform more computation intensive operations, e.g., matrix multiplication. In some embodiments, the computing IC 110 may be used as a hardware accelerator to the controller 102. In the description below, a computing IC, e.g., the computing IC 110, 120, or 140, may be simply referred to as a computing device.

In embodiments, the computing device 110 may include multiple physical layers, e.g., a physical network layer 107, a physical computing layer 105, and a physical memory layer 109 (hereinafter, simply a network layer 107, a computing layer 105, and a memory layer 109). In addition, other physical layers may be included as well, e.g., a physical power delivery layer, or a physical communication layer, not shown. The network layer 107 has a first side and a second side opposite to the first side. The computing layer 105 is adjacent to the first side of the network layer 107 and the memory layer 109 is adjacent to the second side of the network layer 107. In various embodiments, when the semiconductor package 103 (having IC 110) is placed on the board 101, the memory layer 109 of the computing device 110 is closer to a top surface of the board 101 than the computing layer 105 of the computing device 110. In other words, the memory layer 109 is above the board 101, the network layer 107 is above the memory layer 109, and the computing layer 105 is above the network layer 107.

In embodiments, one or more of the network layer 107, the computing layer 105, or the memory layer 109 each includes multiple dies, e.g., a die 112. For example, the network layer 107 may include a first set of dies, the computing layer 105 may include a second set of dies, and the memory layer 109 may include a third set of dies. At least a die of the second set of dies is adjacent to the first side of the network layer 107, and at least a die of the third set of dies is adjacent to the second side of the network layer 107. A die of the multiple dies includes multiple tiles, e.g., a tile 114. For example, a die of the first set of dies for the network layer 107 includes multiple tiles, at least a die of the second set of dies for the computing layer 105 includes multiple tiles, and at least a die of the third set of dies for the memory layer 109 includes multiple tiles. A tile of the memory layer 109 includes one or more storage cells. In some embodiments, there may be up to about $O(10^4)$ tiles on the network layer 107, the computing layer 105, or the memory layer 109.

In embodiments, since the network layer 107, the computing layer 105, or the memory layer 109 includes multiple dies, the semiconductor package 103 containing the computing device 110 has a volume larger than a volume of today's typical semiconductor package that includes only one die. For example, the board 101 may be a U-card, and the multiple dies in the network layer 107 may form a super-reticle to expand the two dimensional surface area to fill the available surface area of the U-card. In some embodiments, a super-reticle formed by multiple dies for the network layer 107, the computing layer 105, or the memory layer 109 may occupy an area up to about 54 in², equivalent to the area of 76 standard full sized reticles. As a result, the throughput per area for the embodiments may result in a 6× performance gain at the board level.

In embodiments, the multiple tiles of the network layer 107 may be dynamically configured to provide a selected one of a plurality of predefined interconnect topologies based on the interconnections among the tiles. In embodiments, the network layer 107 may include multiple selectable pre-defined topologies, with each topology of the multiple pre-defined interconnect topologies based on a communication pattern related to a workload, e.g., a matrix multiplication.

In embodiments, the network layer 107 may include a single-hop circuit-switched network to support circuit-switching, where the single-hop circuit-switched network is configured by software. The single-hop circuit-switched network may include one or more signal pathways or virtual circuits (VC). For example, the network layer 107 may include a VC 142 starting at a tile 141 and ending at a tile 143, where the VC 142 is a direct, unbuffered signal pathway extending through multiple tiles of the network layer 107. The network layer 107 may include one or more signal pathways or VCs, e.g., the VC 142, dynamically configurable between multiple pre-defined topologies for the multiple tiles on the die of the network layer 107.

In addition, the network layer 107 may also include a multi-hop packet switched network to support packet-switching. In embodiments, data may move between two tiles in the computing layer 105 or between a tile in the computing layer 105 and a storage cell of the memory layer 109 through a signal pathway of the single-hop circuit-switched network in the network layer 107, or through a path in the multi-hop packet switched network in the network layer 107. In detail, a tile in the computing layer 105 is arranged to move data to another tile in the computing layer 105 or a storage cell of the memory layer 109 through the one or more signal pathways in the network layer 107.

In embodiments, as shown in FIG. 1(b), the computing IC 120 includes a network layer 127, a computing layer 125, and a memory layer 129, which may be similar to the network layer 107, the computing layer 105, and the memory layer 109. The memory layer 129 includes a control logic sublayer 131, and one or more storage cell sublayers 133 having storage cells. Similarly, the network layer 127 or the computing layer 125 may also include one or more sublayers, not shown. A sublayer may refer to a single physical layer in a three dimensional grouping of layers.

In embodiments, as shown in FIG. 1(c), the computing IC 140 includes a network layer 147, a computing layer 145, and a memory layer 149, which may be similar to the network layer 107, the computing layer 105, and the memory layer 109. In addition, the IC 140 further includes an input/output (I/O) layer 148. The I/O layer 148 may be placed below memory layer 149. In some other embodiments, the I/O layer 148 may be placed in other locations. There may be further other layers, e.g., a power supply layer, a communication layer, not shown. The memory layer 149 includes a control logic sublayer 151, and one or more storage cell sublayers 153 having storage cells. Similarly, the network layer 147, the computing layer 145, or the I/O layer 148 may also include one or more sublayers, not shown.

In embodiments, the computing system 100 may be implemented by various technologies for the components. For example, the computing layer 105 and the memory layer 109 may form processing-in-memory (PiM) components. A PiM component may have a compute element, e.g., a processor core, a central processing unit (CPU), a processing engine (PE), in immediate spatial proximity to dense memory storage to reduce energy used for data transport. For example, networked processor cores may be embedded directly into the base layer of a DRAM stack. Furthermore, the computing layer 105 may have components based on low frequency design. For a given compute pipeline, lowering the target frequency prior to synthesis enables savings across the design stack, from cell selection, to component count, to clock provisioning, to placement area.

In embodiments, the network layer 107 in the computing system 100 may form a dynamically configurable on-die interconnect, sometimes referred to as a switchable topology machine, with dynamically configurable on-die network that supports near instantaneous switching between multiple preconfigured interconnect topologies. In addition, the network layer 107 may support unsupervised distributed place and route. In the presence of multiple faults, unsupervised routing of on-die signal pathways may be performed by hardware or software methods based on decentralized local interactions between adjacent tiles. Dedicated signal pathways may be produced that are optimized against selectable criteria such as latency, energy, heat, or routing density.

In embodiments, the multiple dies in the network layer 107, the computing layer 105, or the memory layer 109 may form a super-reticle by various techniques, e.g., by die stitching. Such super-reticles may improve energy efficiency of inter-node data transport. Fabrication techniques for printing monolithic structures may be used to produce the super-reticles with a 2D area larger than that of a single reticle.

In embodiments, dataflow execution model may be applied to the computing device 110. The regular design of tiles for the various physical layers may provide a systolic compute fabric leading to inherently stationary latency and throughput. In practice, the inherently stationary latency and throughput for the computing device 110 may be scale invariant with some small runtime variance.

There are many advantages for the computing system 100. For example, the computing system 100 may embed compute elements near the memory in the computing layer 105 or the memory layer 109 to reduce the energy for data transport. The computing layer 105 may lower the energy per unit area of computing by lowering the clock frequency, e.g., to 200 MHz or 1 GHz. The semiconductor package 103 may include a single large board-scale monolithic tile array including all the board's compute and memory elements, hence improving the performance that may be lost due to the lower clock frequency for the computing layer 105. Even though a large board-scale monolithic tile array may normally have a low yield with reduced precision modeling of performance, the network layer 107 may employ a dynamically configurable hybrid packet and circuit-switched network architecture to overcome such low yield and precision. Workloads coded as large monolithic graphs can employ the dataflow execution model to re-establish determinism. This enables high precision performance modeling with minimal variance across runs.

In embodiments, the multiple physical layers of the computing device 110 enable shorter distance and low energy interconnect between computing elements and large-capacity memory, compared to an alternative design of placing all the computing elements and large-capacity memory in a same layer. For example, for the computing device 110 with multiple physical layers, 80 fused multiply-add (FMA) computing components may access 64 MB of memory positioned within 1.5 mm, which may be difficult to achieve for other alternative designs. In addition, the low frequency design components used in the computing layer 105 can lower the thermal density, enabling three dimensional stacking. Extra-reticle patterning enables 2D scaling via simple repetition. For some examples, the peak performance of a single reticle (19.6 TFLOP/s) may be scaled to 1 PFLOP/s for a 1U-compute board with a 54 in² super-die stack. The configurable on-die network at the network layer 107 further supports 2D scaling by customizing network topologies to workload communication patterns. Distributed place and route algorithms for the network layer 107 may route around defective tiles. Hardware extensions of circuit-switched terminal points enable 2D scaling of the dataflow fabric by enabling direct connections between fabrics on separate tiles of the computing layer 105 through the network layer 107.

Figure 2:
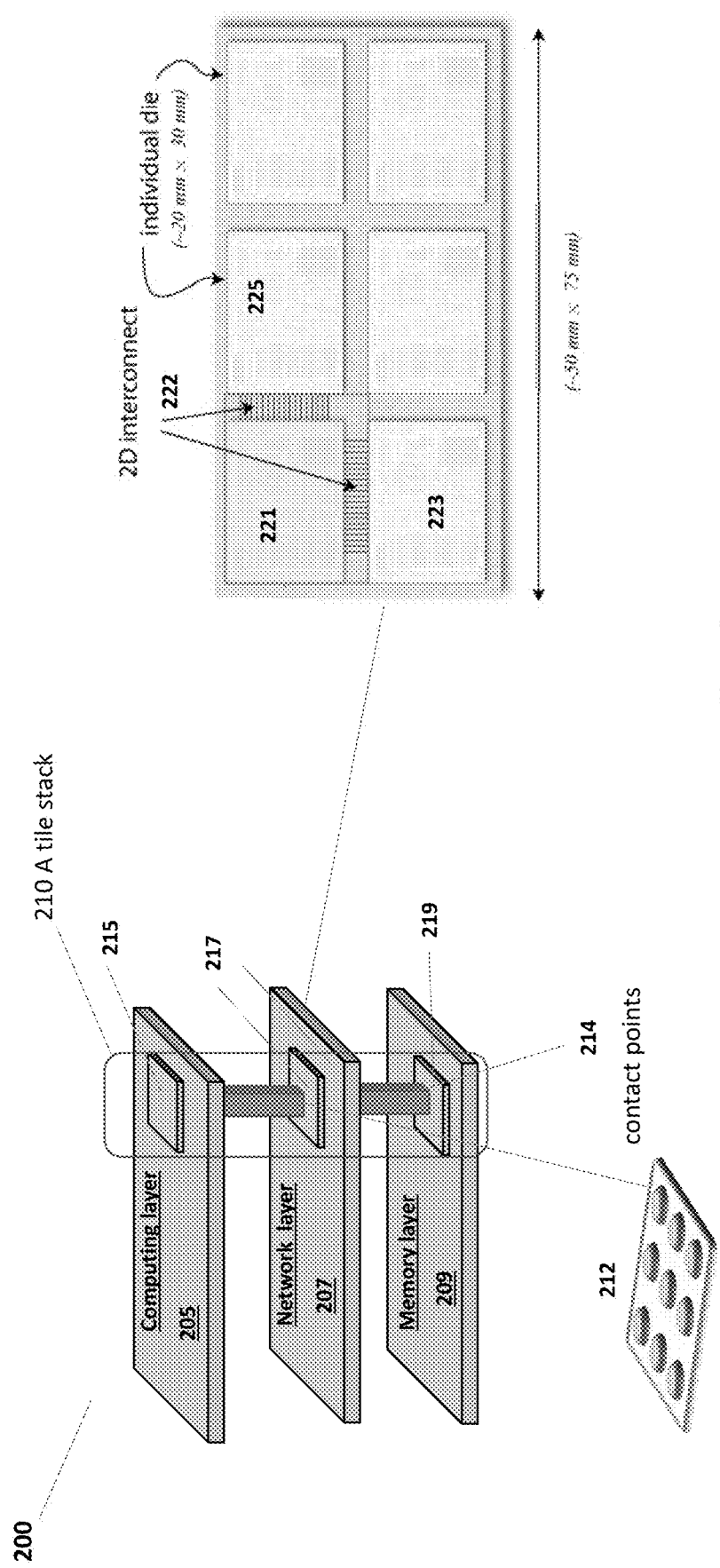
FIG. 2 illustrates an exemplary computing IC including multiple physical layers formed by multiple dies and tiles, in accordance with various embodiments.

FIG. 2 illustrates an exemplary computing IC 200 including multiple physical layers formed by multiple dies and tiles, in accordance with various embodiments. In embodiments, the computing IC 200 may be an example of the computing IC 110, 120, 140, as shown in FIGS. 1(a)-1(c).

In embodiments, the computing IC 200 includes a network layer 207, a computing layer 205, and a memory layer 209, which may be similar to the network layer 107, the computing layer 105, and the memory layer 109, as shown in FIG. 1(a). The network layer 207, the computing layer 205, or the memory layer 209 may be coupled together by through-silicon vias (TSV) 214. Additionally and alternatively, the network layer 207, the computing layer 205, or the memory layer 209 may be bonded together by direct bonding, where one or more contact points 212 of a first tile in a first layer is in direct contact with one or more contact points of a second tile of a second layer, the first layer or the second layer may be selected from the network layer 207, the computing layer 205, or the memory layer 209.

In embodiments, the computing IC 200 may include one or more tile stacks, e.g., a tile stack 210, which may be viewed as an atomic element of a complete computing system implemented as 3D stack of monolithic layers. The tile stack 210 includes a computing tile 215 in the computing layer 205, a network tile 217 in the network layer 207, and a tile 219 in the memory layer 209. The computing tile 215, the network tile 217, and the tile 219 in the memory layer 209 may be substantially vertically aligned, one over another. In some embodiments, the computing tile 215, the network tile 217, and the tile 219 may represent multiple tiles stacked together. For example, the tile 219 may include a tile of a control sublayer of the memory layer 209, and one or more storage tiles of one or more storage sublayers of the memory layer 209.

In embodiments, any of the network layer 207, the computing layer 205, or the memory layer 209 may include multiple dies. For example, the network layer 207 has a die 221, a die 223, a die 225, and other dies, which are on a super-reticle. Interconnect line 222 may be between the die 221 and the die 223 to couple a first device in the die 221 to a second device of the die 223, or between the die 221 and the die 225 to couple a first device in the die 221 to a second device of the die 225. In some embodiments, the individual die may be of a size about 20 mm to about 30 mm, while the super-reticle formed for the network layer 207 may be of a size about 50 nm to about 75 mm, which may be 6 times larger than a single die. Other physical layers, e.g., the computing layer 205 and the memory layer 209 may be on a super-reticle as well. Additionally and alternatively, the computing layer 205 and the memory layer 209 may be designed differently as showing in FIGS. 3(a)-3(b) below.

Figure 3A:
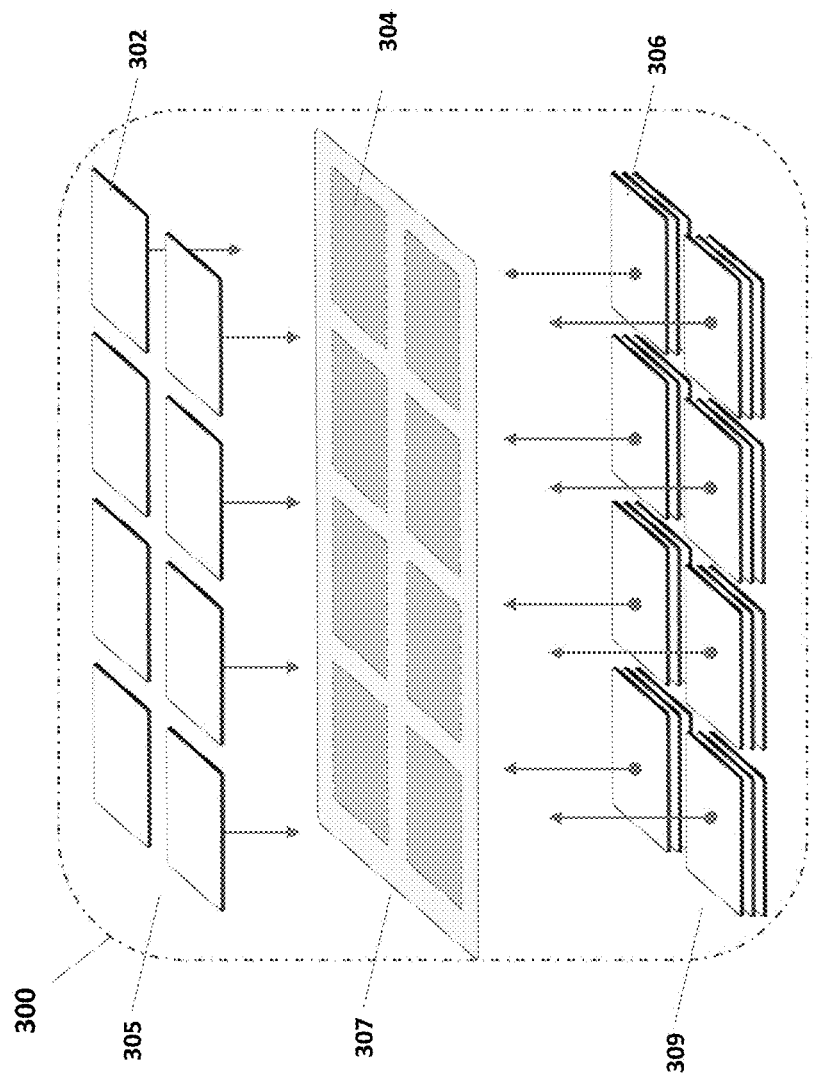
FIGS. 3(a)-3(b) illustrate another exemplary computing IC including multiple physical layers having multiple dies and tiles, in accordance with various embodiments.
Figure 3B:
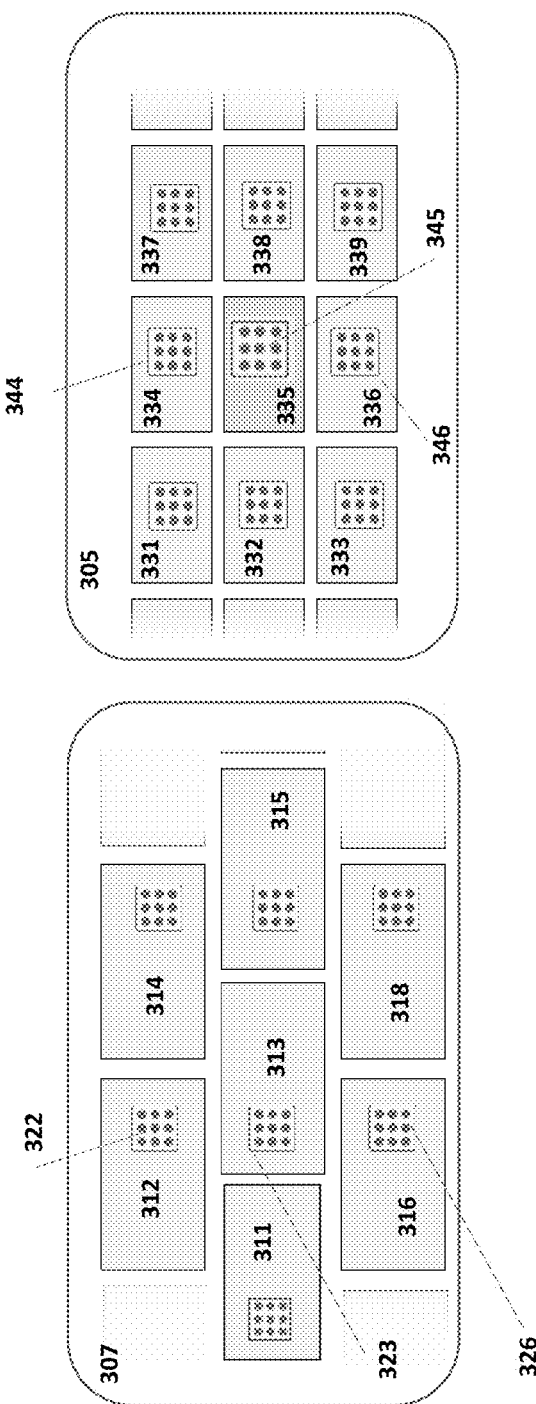

FIGS. 3(a)-3(b) illustrate another exemplary computing IC 300 including multiple physical layers having multiple dies and tiles, in accordance with various embodiments. In embodiments, the computing IC 300 may be an example of the computing IC 110, 120, 140, as shown in FIGS. 1(a)-1(c), or the computing IC 200 as shown in FIG. 2.

In embodiments, as shown in FIG. 3(a), the computing IC 300 may include the network layer 307 formed on a super-reticle, which may be similar to the super-reticle for the network layer 207 shown in FIG. 2. The network layer 307 includes a super-reticle having multiple dies, e.g., a die 304, interconnected by interconnect lines. Instead of being a super-reticle, the computing layer 305 or the memory layer 309 may include one or more chiplets, e.g., a chiplet 302, or a chiplet 306. A chiplet may be a silicon die in a small form factor. A tile of a chiplet may be coupled or bonded to a tile of a die of the super-reticle for the network layer 307. For example, a tile of the chiplet 302 is bonded to a tile of the die 304. Similarly, a tile of the chiplet 306 is coupled to a tile of the die 304. By using only one super-reticle for the network layer 307 and using chiplets for other physical layers, the computing IC 300 may be more flexible in design and improve the yield, assembly and wafer utilization of the overall systems. In embodiments, all the chiplets of the computing layer 305 may be above the network layer 307, and all the chiplets of the memory layer 309 may be below the network layer 307. Hence, even when the memory layer 309 or the computing layer 305 are implemented by discrete chiplets, the memory layer 309 is still below the network layer 307 and the computing layer 305 is still above the network layer 307.

In embodiments, as shown in FIG. 3(b), the network layer 307 includes a monolithic super-die containing multiple tiles assembled into a hexagonal tile array. Other physical layers, e.g., the computing layer 305 may have Cartesian tile arrays, which can be singulated into various sizes of chiplets and bonded directly to the network layer 307.

In embodiments, the network layer 307 may include multiple tiles 311-318, organized into a radix 6 array shape with multiple rows, e.g., three rows. Each tile may have one or more contact points, which may be used for direct bonding or to contact with TSV. All the contact points of a tile are confined to an area less than or equal to ½ of the tile, e.g., a left half or a right left that is opposite to the left half of the tile. For example, at a first row, for the tile 316 and the tile 318, the contact points are at the right half of the tile area; at a second row, for the tile 311, the tile 313, and the tile 315, the contact points are at the left half of the tile area. Similarly, at a third row, for the tile 312 and the tile 314, the contact points are at the right half of the tile area. The pattern of the contact points can be continued for the network layer 307 so that if all the tiles in row n have their contact points on the left half, then all the tiles in row n+1 have their contact points on the right half. As a result of the arrangements of the radix 6 grid pattern on the network layer 307, the contact points of the tiles for the network layer 307 may result in an interface pattern as seen by other layers, e.g., the compute layer 305 or the memory layer 309 as a Cartesian array. For example, the contact points 322 of the tile 312, the contact points 323 of the tile 313, and the contact points 326 of the tile 316, become vertically aligned.

In embodiments, the computing layer 305 may include multiple tiles 331-339, organized into a radix 4 Cartesian array shape in a standard north, east, west, and south (NEWS) grid. In some other embodiments, the multiples 331-339 may be for the memory layer 309 instead of the computing layer 305. One or more contact points of a first tile in the network layer 307 may be in direct contact with one or more contact points of a second tile of the computing layer 305 or the memory layer 307. For example, the contact points 322 of the tile 312 of the network layer 307 may be in direct contact with the contact points 344 of the tile 334 of the computing layer 305, the contact points 323 of the tile 313 may be in direct contact with the contact points 345 of the tile 335, and the contact points 326 of the tile 316 may be in direct contact with the contact points 346 of the tile 336.

FIGS. 4(a)-4(d) illustrate more details of a multiple layer tile stack 410 of an exemplary computing IC, in accordance with various embodiments. In embodiments, the tile stack 410 may be an example of the tile stack 210 of the computing IC 200 that includes one or more tile stacks, as shown in FIG. 2.

Figure 4A:
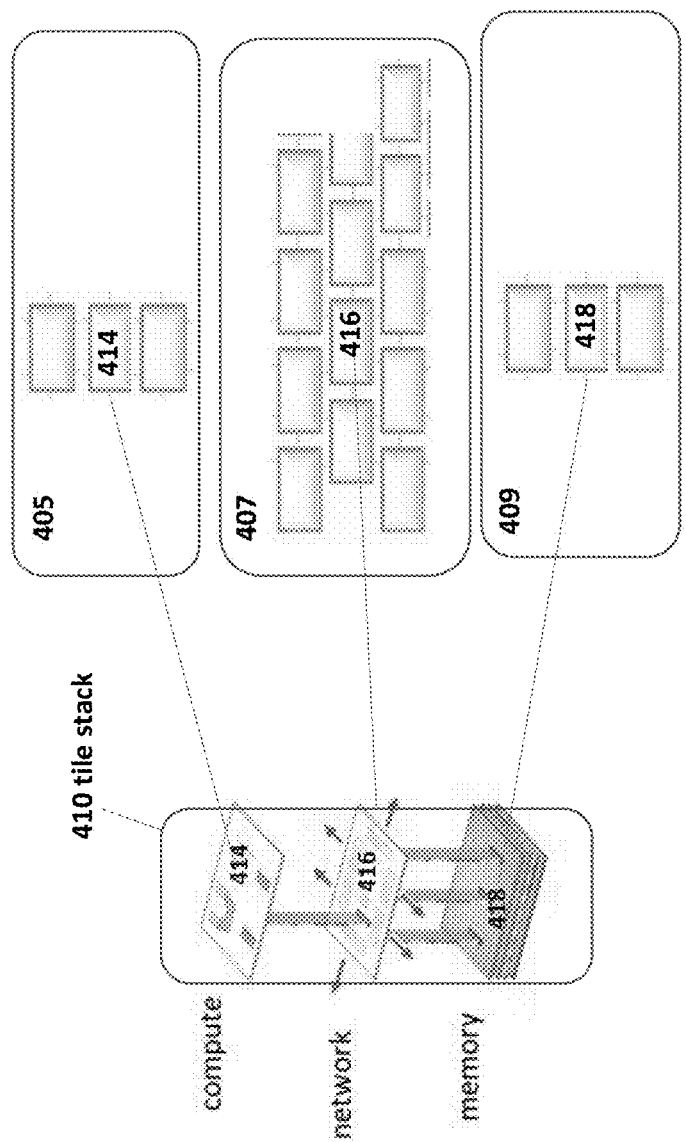
FIGS. 4(a)-4(d) illustrate more details of a multiple layer tile stack of an exemplary computing IC, in accordance with various embodiments.

In embodiments, as shown in FIG. 4(a), the tile stack 410 includes a computing tile 414 in a computing layer 405, a network tile 416 in a network layer 407, a memory tile 418 in a memory layer 409. The computing tile 414, the network tile 416, and the memory tile 418 are substantially vertically aligned. In some embodiments, the memory tile 418 may represent a memory tile stack or a memory stack having multiple tiles in multiple sublayers, e.g., a tile of a control sublayer of the memory layer, and one or more storage tiles of one or more storage sublayers of the memory layer. For example, the memory tile 418 may be a memory tile stack including 9-layer memory sublayers having one control sublayer and 8 storage sublayers. The computing tile 414, the network tile 416, the tile of a control sublayer, and the one or more storage tiles of the memory layer have substantial vertical alignment.

In some embodiments, the tile stack 410 may have a 1 mm footprint. The small tile stack footprint area may reduce the blast zone of individual defects. Furthermore, computing ICs on the computing tile 414 may have a low frequency system clock and components designed for low frequency, e.g., a frequency of about 250 MHz or slower than 1 GHz. The low frequency design drives down switching energy and heat low enough to permit 3D stacking of the multiple tiles in the tile stack 410. Furthermore, slow cycle times motivates use of energy efficient resistive memory in the memory tile 418 or the memory stack. The memory tile 418 may have single cycle-access that enables hardware savings in the computing layer by eliminating cache and prediction circuitry.

Figure 4B:
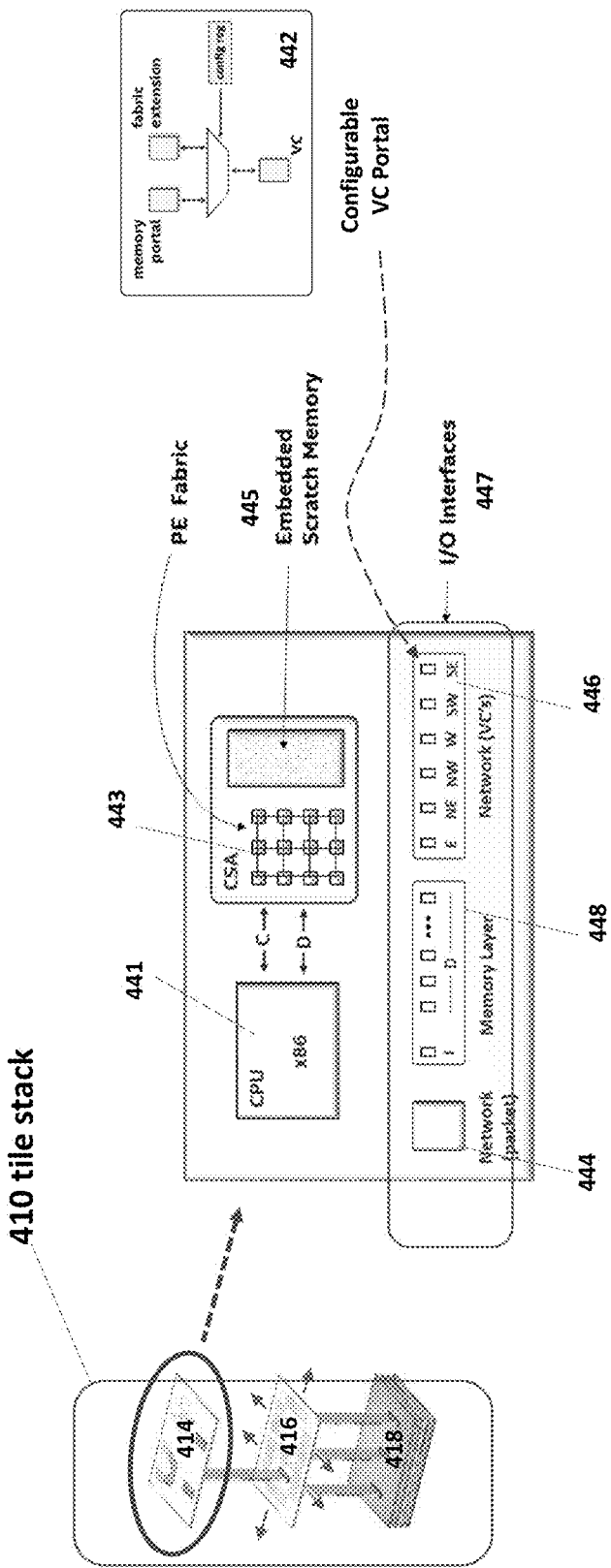

In embodiments, as shown in FIG. 4(b), the computing tile 414 includes an input/output (I/O) interface 447. The I/O interface 447 includes a memory interface 448, a network interface 444, and VC ports 446. The computing tile 414 also includes various computing elements, e.g., a CPU 441, and a dataflow fabric 443. The dataflow fabric 443 may be a configurable spatial array (CSA) including multiple PEs and a scratch memory 445. There may be other computing elements, e.g., a processor core, or an application specific integrated circuit (ASIC) in the computing tile 414.

In embodiments, the dataflow fabric 443 may be an architectural subset of the configurable spatial array dataflow fabric including about 256 PEs, operating with 200 MHz system clock. An operation performed by the dataflow fabric 443 may access data stored in the scratch memory 445 embedded in the dataflow fabric 443, or a memory bank in the memory tile 418. The bulk of the computing may take place on the dataflow fabric 443 with simplified memory access model. For example, the computing tile 414 may have no support for coherency. The virtual-physical address translation may be embedded in the control logic of the memory tile 418. Input and output to the dataflow fabric 443 can come from the CPU 441, the memory interface 448, the network interface 444, or the VC ports 446. The scratch memory 445 within the dataflow fabric 443 may expand capacity and configurability of the dataflow fabric 443.

In embodiments, the CPU 441 may be a simple x86 core (single issue, in-order, no cache), or an embedded controller. The CPU 441 may fetch data via portals in the memory interface 448 to dedicated banks of the memory stack 418. A low frequency system clock, e.g., 200 MHz system clock, enables single-cycle latency on instruction fetch and data load/store for the CPU 441, obviating the need for cache, or hardware support for prediction. In addition, the CPU 441 may perform operations related to managing boot, packet messages, and network controller. The CPU 441 may configure the dataflow fabric 443 and performs exception processing as needed.

In embodiments, the I/O interface 447 of the computing tile 414 includes the memory interface 448, the network interface 444, and VC ports 446. The memory interface 448 includes one or more portals to the memory layer, e.g., the memory tile 418. The network interface 444 includes one or more portals to a multi-hop packet switched network of the network layer 407. The packet portal is analogous to a light-weight mesh stop were multi-hop messages addressed to the tile are buffered. The VC ports 446 includes one or more portals to a single-hop circuit-switched network of the network layer 407, where the network layer 407 includes the multi-hop packet switched network to support packet-switching, and the single-hop circuit-switched network to support circuit-switching. As shown, there may be six VC portals that serve as terminal points or contact points for up to six point-to-point VCs. These VC portals can be configured by configuring a selector 442 to act as either a memory portal or a direct extension to the CSA dataflow fabric. In the latter mode, the CPU's on two cooperating tiles can created direct links between their dataflow fabric 443.

Figure 4C:
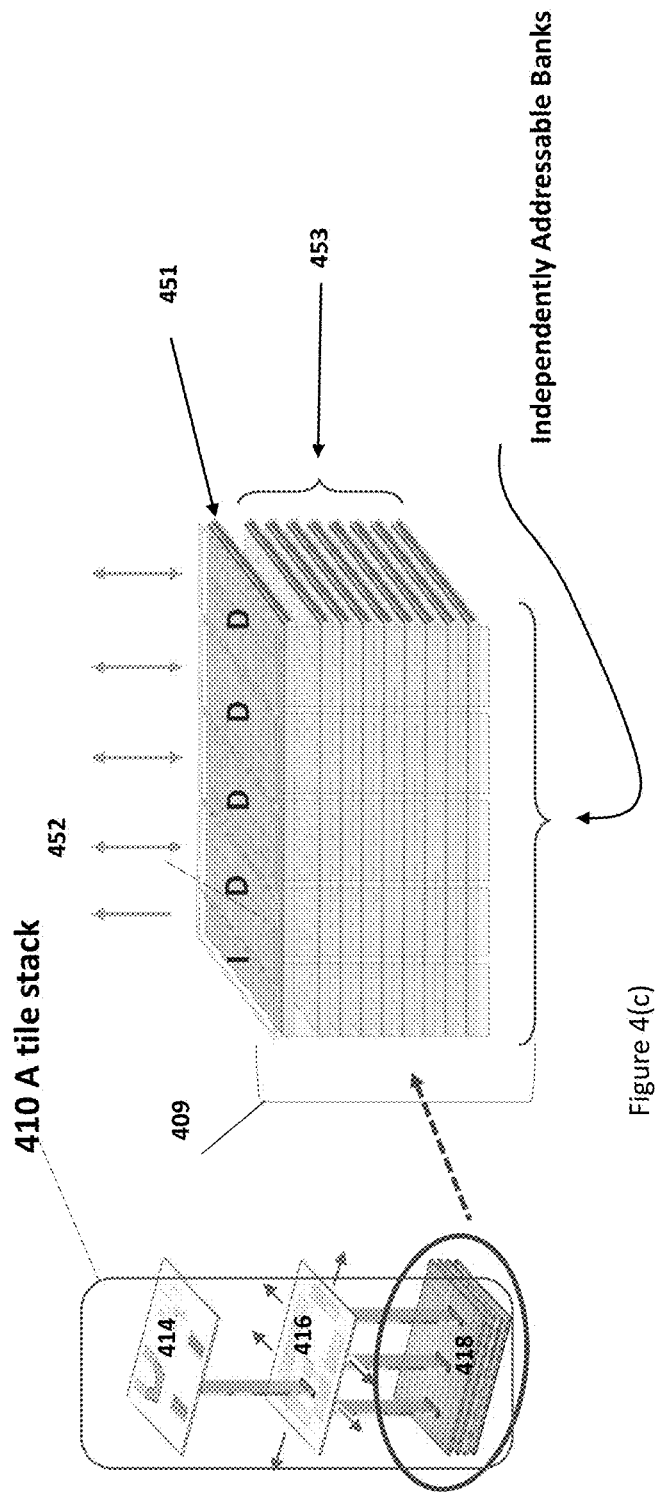

In embodiments, as shown in FIG. 4(c), the memory tile 418 represents a memory tile stack or a memory stack having multiple tiles in multiple sublayers, e.g., a tile of a control sublayer 451 of the memory layer 409, and one or more storage tiles of one or more storage sublayers 453, e.g., 8 storage sublayers, of the memory layer 409. In some embodiments, the 8 storage sublayers 453 may have net capacity of 80 MB (16 MB for instruction, 64 MB for data). The data portion of the 8 storage sublayers 453 may be organized in banks, e.g., a bank 452, independently addressable via dedicated ports. The logic in the control sublayer 451 subdivides the address space into separately addressable banks. For each bank, e.g., the bank 452, the control logic performs cell selection, signal preconditioning, and error recovery.

In embodiments, the minimum access granularity for the 8 storage sublayers 453 may be single byte, and maximum transfer rate may be 8 bytes per cycle on each port. The memory tile 418 may also support unbuffered, single cycle reads. In some embodiments, a memory stack configured as 16 banks @2 MB per bank with a 200 MHz system clock may deliver a bandwidth density of 26 GB/s per mm$^2$. The 600 tiles covering the area of a standard reticle may deliver an aggregate of 15.3 TB/s of access bandwidth operating on 19.3 GB of storage.

In embodiments, the 8 storage sublayers 453 may be implemented as spin-transfer torque magnetic random-access memory (STT-MRAM) storage technology. The STT-MRAM storage medium combines desirable properties in retention, endurance, and a bit density on par with DRAM. A bit cell of STT-MRAM storage cell is bistable that expends near zero standby power. STT-MRAM storage technology is compatible with CMOS foundry, with bit cells topologies that are inherently amenable to generational CMOS scaling.

Figure 4D:
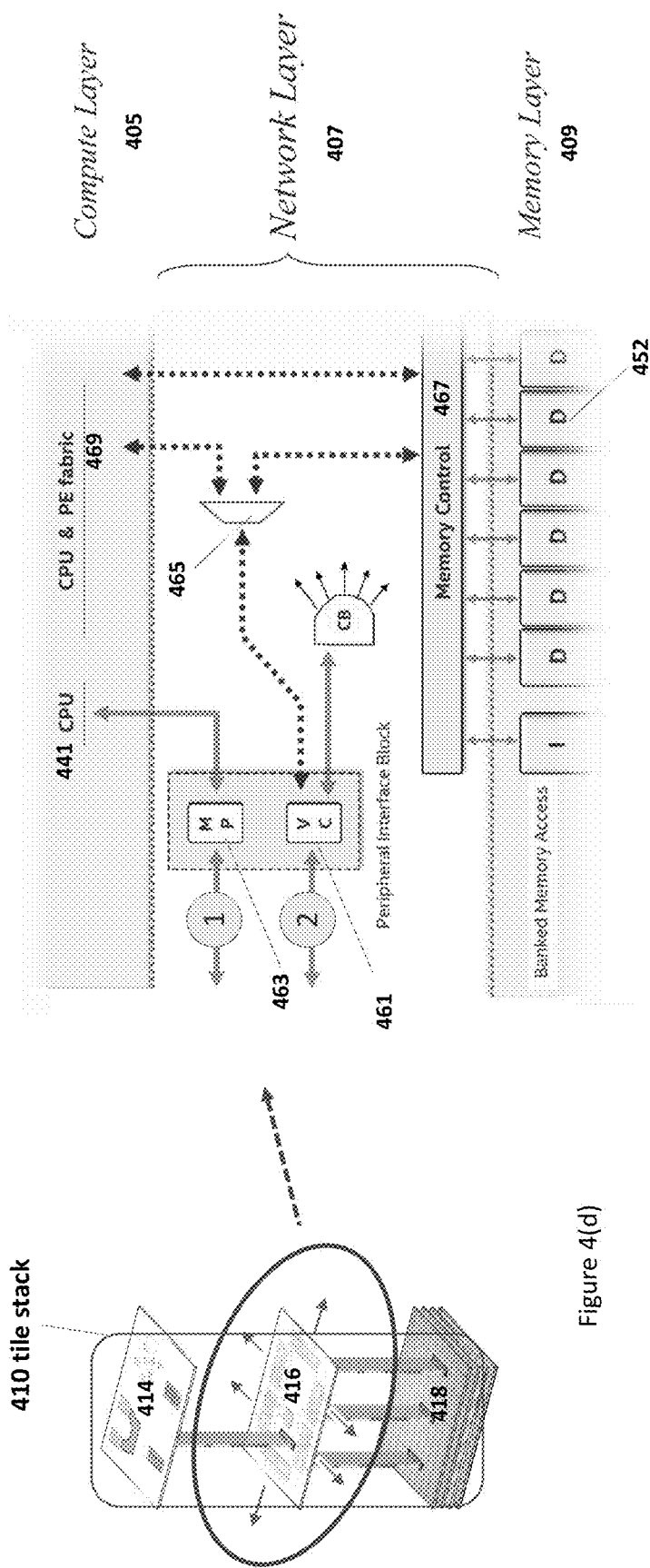

In embodiments, as shown in FIG. 4(d), the network tile 416 includes a virtual VC portal 461 to form a segment of a virtual circuit for a single-hop circuit-switched network to support circuit-switching, and message passing storage 463 to support a multi-hop packet switched network for packet-switching.

The portal 461 can be coupled to a multiplexer 465 to be selectively coupled to a storage cell in the memory layer 409, or to a computing element 469 of the computing tile 414 of the computing layer 405. The network tile 416 functions as an integrated nexus for data movement, both within the tile stack and between the tile and its neighbors. The network tile 416 is different from other network tiles that may only function as a pass-through for direct interconnect between memory portals in the compute layer and control logic of the memory stack. With the portal 461, VC signaling is expanded to selectively route directly to a compute element in the computing layer 405, or to the address ports of a D-bank 452 in the memory layer 409. A layer of memory control logic 467 may be inserted between the memory portals in the compute layer 405 and the control logic of the memory stack, e.g., the memory stack 453 shown in FIG. 4(c). The memory control logic 467 enables address ports of a D-bank 452 of the memory stack 453 to be dynamically mapped to either the associated port on the compute layer 405, or the VC port 461.

FIGS. 5(a)-5(c) illustrate more details of dataflow computations by multiple tile stacks, e.g., a tile stack 510 and a tile stack 520, of an exemplary computing IC, in accordance with various embodiments. In embodiments, the tile stack 510 and the tile stack 520 may be an example of the tile stack 210 as shown in FIG. 2, or the tile stack 410 as shown in FIGS. 4(a)-4(d).

In embodiments, as shown in FIG. 5(a), the tile stack 510 includes a computing tile 514 in a computing layer 505, a network tile 516 in a network layer 507, and a memory tile 518 in a memory layer 509. In some embodiments, the memory tile 518 may represent a memory tile stack or a memory stack having multiple tiles in multiple sublayers, e.g., a tile of a control sublayer of the memory layer, and one or more storage tiles of one or more storage sublayers of the memory layer. Similarly, the tile stack 520 includes a computing tile 524 in the computing layer 505, a network tile 526 in the network layer 507, and a memory tile 528 in the memory layer 509.

In embodiments, as shown in FIG. 5(b), a computing element 525, e.g., a CPU, of the computing tile 524 of the tile stack 520 is configured to have memory access to one or more storage cells 519 of the tile stack 510. The memory access by the computing element 525 is through a VC portal 527 of the network tile 526 of the tile stack 520 and a VC portal 517 of the network tile 516 of the tile stack 510.

In embodiments, as shown in FIG. 5(c), computing element 523 of computing tile 524 in tile stack 520 is configured to be coupled through VC 531 to computing element 513 of computing tile 514 in tile stack 510. VC 531 includes a first VC portal 521 of network tile 526 of tile stack 520 and a second VC portal 511 of network tile 516 of tile stack 510. Computing element 523 and computing element 513 may be a PE inside a dataflow fabric. VC 531 couples computing element 523 in the dataflow fabric in computing tile 524 to computing element 513 in the dataflow fabric in computing tile 514, extending the dataflow fabric from one computing tile to another tile. Furthermore, computing element 523 may perform operations related to dataflow graph 522, and computing element 513 may perform operations related to dataflow graph 512. A node of dataflow graph 512 may be coupled to a node of dataflow graph 522 by an edge 533, corresponding to VC 531. Hence, a single large graph can be subdivided into two, and overlaid on the dataflow fabrics of tile stack 510 and tile stack 520, with the connecting edge overlaid on the VC.

In embodiments, the computing system 100 (including computing IC 110) may employ one or more tile stacks, e.g., tile stack 210, tile stack 410, tile stack 510, or tile stack 520, to perform operations, e.g., matrix-matrix multiplication. A performance model for matrix-matrix multiplication illustrates the power of the computing system 100 with the various tile stacks. The matrix multiplication operation may be instantiated as a single large dataflow graph and folded directly onto the tile stacks of the computing system 100. In an experiment, throughput is scaled by growing the size of the tile array and by expanding the dataflow graph to utilize the additional tiles. Performance is modeled as the tile array scales from 5K to 40K nodes, achieving 1 PFlop/s sustained performance at approximately 34K nodes.

Figure 6:
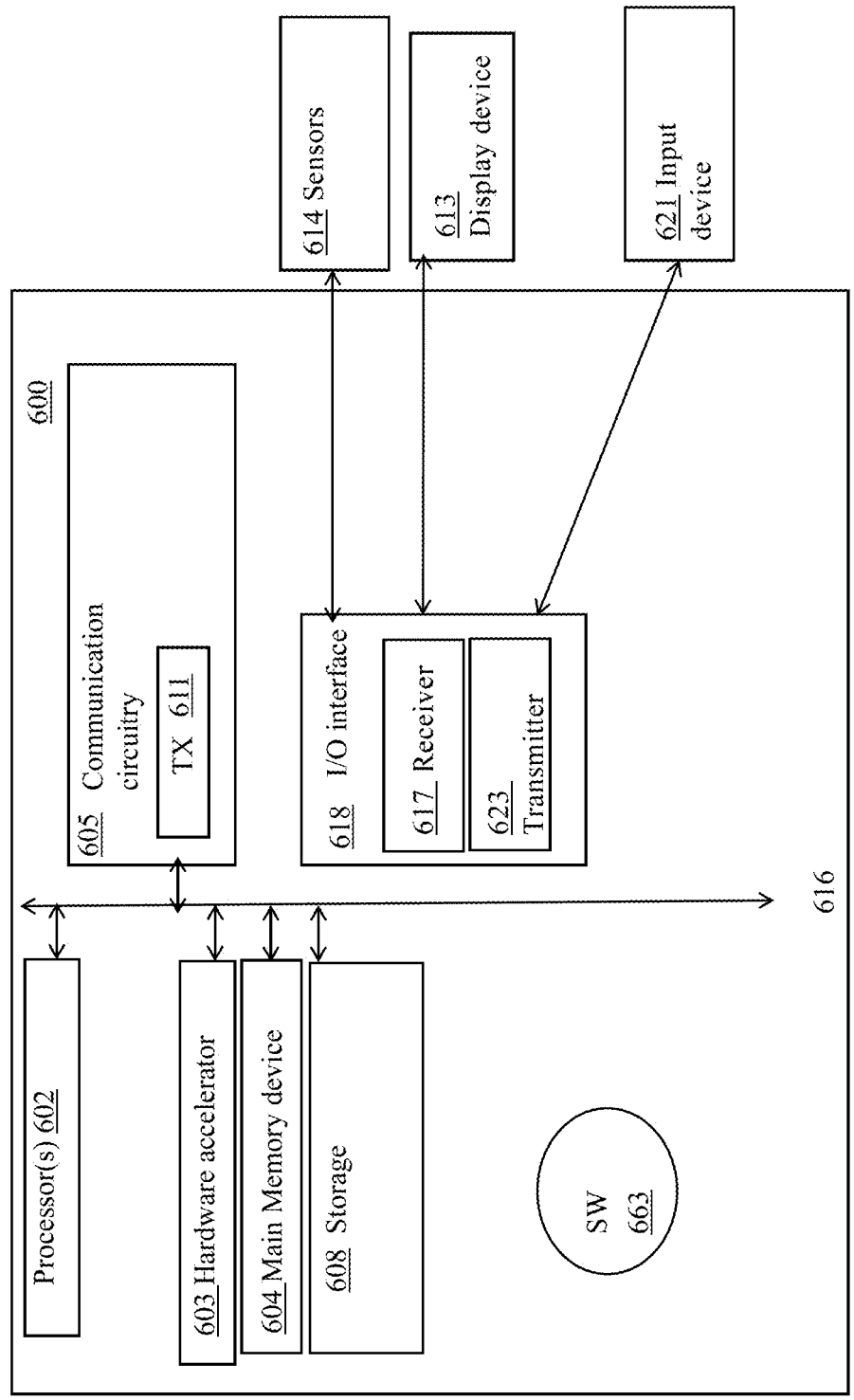
FIG. 6 illustrates an example computing system formed with computing ICs of the present disclosure, in accordance with various embodiments.

FIG. 6 illustrates an example computing system 600 formed with computing ICs of the present disclosure, in accordance with various embodiments. The computing system 600 may be with various embodiments of the earlier described computing ICs.

As shown, the system 600 may include one or more processors 602, and one or more hardware accelerators 603.

The hardware accelerator 603 may be an example of the computing IC 110, 120, 140, as shown in FIGS. 1(a)-1(c), the computing IC 200 as shown in FIG. 2, the computing IC 300 as shown in FIGS. 3(a)-3(b), with further details of a computing IC as shown in FIGS. 4(a)-4(d), and in FIGS. 5(a)-5(c). A software module 663 may be executed by the execution unit(s) 602. Additionally, the computing system 600 may include a main memory device 604, which may be any one of a number of known persistent storage media, and a data storage circuitry 608. In addition, the computing system 600 may include an I/O interface circuitry 618 having a transmitter 623 and a receiver 617, coupled to one or more sensors 614, a display device 613, and an input device 621. Furthermore, the computing system 600 may include communication circuitry 605 including e.g., a transceiver (Tx) 611. The elements may be coupled to each other via bus 616.

In embodiments, the processor(s) 602 (also referred to as "execution circuitry 602") may be one or more processing elements configured to perform basic arithmetical, logical, and input/output operations by carrying out instructions. Execution circuitry 602 may be implemented as a standalone system/device/package or as part of an existing system/device/package.

In embodiments, memory 604 (also referred to as "memory circuitry 604" or the like) and storage 608 may be circuitry configured to store data or logic for operating the computer device 600. Memory circuitry 604 may include a number of memory devices that may be used to provide for a given amount of system memory. As examples, memory circuitry 604 can be any suitable type, number and/or combination of volatile memory devices (e.g., random access memory (RAM), dynamic RAM (DRAM), static RAM (SRAM), etc.) and/or non-volatile memory devices (e.g., read-only memory (ROM), erasable programmable read-only memory (EPROM), electrically erasable programmable read-only memory (EEPROM), flash memory, antifuses, etc.) that may be configured in any suitable implementation as are known.

The number, capability and/or capacity of these elements 602-663 may vary, depending on the number of other devices the device 600 is configured to support. Otherwise, the constitutions of elements 602-661 are known, and accordingly will not be further described.

As will be appreciated by one skilled in the art, the present disclosure may be embodied as methods or computer program products. Accordingly, the present disclosure, in addition to being embodied in hardware as earlier described, may take the form of an entirely software embodiment (including firmware, resident software, micro-code, etc.) or an embodiment combining software and hardware aspects that may all generally be referred to as a "circuit," "module," or "system."

Figure 7:
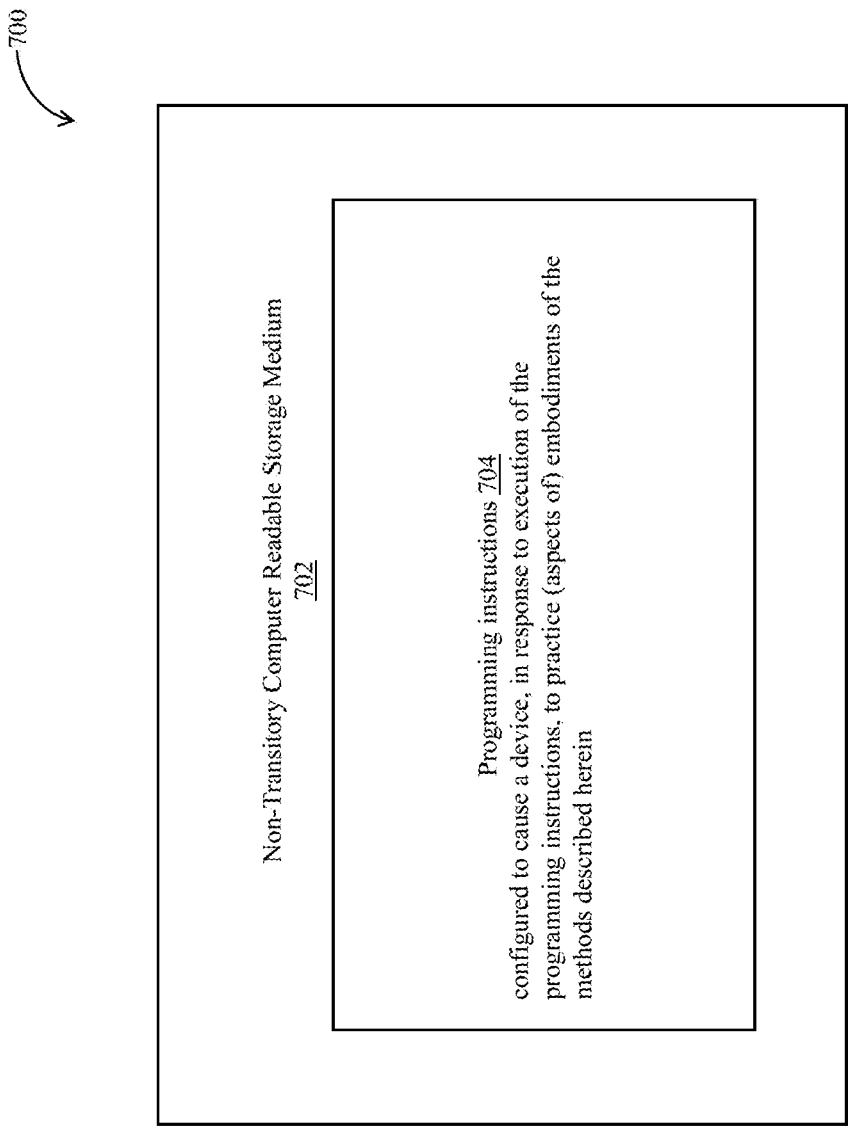
FIG. 7 illustrates a storage medium having instructions for implementing various system services and applications on a computing system formed with computing ICs described with references to FIGS. 1-6, in accordance with various embodiments.

FIG. 7 illustrates an example computer-readable non-transitory storage medium that may be suitable for use to store instructions that cause an apparatus or a computing device, in response to execution of the instructions by the apparatus or the computing device, to implement various system services or application on a computing system formed with the computing IC of the present disclosure. As shown, non-transitory computer-readable storage medium 702 may include a number of programming instructions 704. Programming instructions 704 may be configured to enable a computing system, e.g., system 600, in particular, processor(s) 602, or hardware accelerator 603 (formed with computing ICs 110, 120, 140, 200 and so forth), in response to execution of the programming instructions, to perform, e.g., various operations associated with system services or applications.

In alternate embodiments, programming instructions 704 may be disposed on multiple computer-readable non-transitory storage media 702 instead. In alternate embodiments, programming instructions 704 may be disposed on computer-readable transitory storage media 702, such as, signals. Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present disclosure is described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Embodiments may be implemented as a computer process, a computing system or as an article of manufacture such as a computer program product of computer readable media. The computer program product may be a computer storage medium readable by a computer system and encoding a computer program instructions for executing a computer process.

The corresponding structures, material, acts, and equivalents of all means or steps plus function elements in the claims below are intended to include any structure, material or act for performing the function in combination with other claimed elements are specifically claimed. The description of the present disclosure has been presented for purposes of illustration and description, but is not intended to be exhaustive or limited to the disclosure in the form disclosed. Many modifications and variations will be apparent to those of ordinary skill without departing from the scope and spirit of the disclosure. The embodiment are chosen and described in order to best explain the principles of the disclosure and the practical application, and to enable others of ordinary skill in the art to understand the disclosure for embodiments with various modifications as are suited to the particular use contemplated.

Thus various example embodiments of the present disclosure have been described including, but are not limited to:

Example 1 may include an integrated circuit, comprising: a physical network layer having a first side and a second side opposite to the first side, and including a first set of dies, wherein a die of the first set of dies includes multiple tiles, wherein the physical network layer further includes one or more signal pathways dynamically configurable between multiple pre-defined interconnect topologies for the multiple tiles, where each topology of the multiple pre-defined interconnect topologies corresponds to a communication pattern related to a workload; a physical computing layer having a second set of dies, with at least a die of the second set of dies being adjacent to the first side of the physical network layer or including multiple tiles; and a physical memory layer having a third set of dies, with at least a die of the third set of dies being adjacent to the second side of the physical network layer, wherein at least a die of the third set of dies includes multiple tiles, and a tile of the memory layer includes one or more storage cells; wherein at least a tile in the physical computing layer is further arranged to move data to another tile in the physical computing layer or a storage cell of the physical memory layer through the one or more signal pathways in the physical network layer.

Example 2 may include the integrated circuit of example 1 and/or some other examples herein, wherein the physical network layer, the physical computing layer, and the physical memory layer are selectively coupled together by through-silicon vias (TSV), or bonded together by direct bonding, where one or more contact points of a first tile in a first of the physical network, computing and memory layers is in direct contact with one or more contact points of a second tile of a second of the physical network, computing and memory layer.

Example 3 may include the integrated circuit of example 1 and/or some other examples herein, wherein at least one of the physical network layer, the physical computing layer, or the physical memory layer includes a super-reticle having multiple dies interconnected by interconnect lines coupling a first device in a first die of the multiple dies to a second device of a second die of the multiple dies.

Example 4 may include the integrated circuit of example 1 and/or some other examples herein, wherein the physical memory layer includes a control logic sublayer, and one or more storage cell sublayers having storage cells, and the physical network layer or the physical computing layer includes one or more sublayers.

Example 5 may include the integrated circuit of example 1 and/or some other examples herein, wherein the physical network layer includes a multi-hop packet switched network to support packet-switching, or a configurable single-hop circuit-switched network to support circuit-switching.

Example 6 may include the integrated circuit of example 1 and/or some other examples herein, wherein the physical network layer includes a super-reticle having multiple dies interconnected by interconnect lines coupling a first device in a first die of the multiple dies to a second device of a second die of the multiple dies, and the physical computing layer or the physical memory layer includes one or more chiplets, a tile of a chiplet of the one or more chiplets is bonded to a tile of a die of the super-reticle for the physical network layer.

Example 7 may include the integrated circuit of example 1 and/or some other examples herein, wherein the physical network layer has multiple tiles organized into a radix 6 array shape with multiple rows, with a tile in a first row having one or more contact points located at a first half of the tile, and a tile in a second row adjacent to the first row having one or more contact points located at a second half of the tile opposite to the first half of the tile, and wherein the physical computing layer or the physical memory layer has multiple tiles organized into a radix 4 array shape in a standard NEWS grid, with one or more contact points of a first tile in the physical network layer being in direct contact with one or more contact points of a second tile of the physical computing layer or the physical memory layer.

Example 8 may include the integrated circuit of example 1 and/or some other examples herein, wherein a tile of the physical computing layer includes an input/output (I/O) interface, a memory interface, a scratch memory, interconnects, or a computing element selected from a processor core, a configurable spatial array (CSA), an application specific integrated circuit (ASIC), a central processing unit (CPU), a processing engine (PE), or a dataflow fabric.

Example 9 may include the integrated circuit of example 8 and/or some other examples herein, wherein the I/O interface of the tile of the physical computing layer includes one or more portals to the physical memory layer, one or more portals to a multi-hop packet switched network of the physical network layer, or one or more portals to a single-hop circuit-switched network of the physical network layer, and wherein the physical network layer includes the multi-hop packet switched network to support packet-switching, and the single-hop circuit-switched network to support circuit-switching.

Example 10 may include the integrated circuit of example 9 and/or some other examples herein, wherein at least a tile of the physical computing layer is arranged to access data stored in the scratch memory of the tile, or a memory bank in the physical memory layer.

Example 11 may include the integrated circuit of example 8 and/or some other examples herein, wherein a tile of the physical network layer includes a message passing storage in a multi-hop packet switched network to support packet-switching, or a virtual circuit (VC) portal to form a segment of a virtual circuit for a single-hop circuit-switched network to be coupled to a storage cell in the physical memory layer or to the computing element of the tile of the physical computing layer.

Example 12 may include the integrated circuit of example 1 and/or some other examples herein, wherein the integrated circuit include one or more tile stacks, where a tile stack of the one or more tile stacks includes a computing tile in the physical computing layer, a network tile in the physical network layer, a tile of a control sublayer of the physical memory layer, and one or more storage tiles of one or more storage sublayers of the physical memory layer, the computing tile, the network tile, the tile of a control sublayer, and the one or more storage tiles being substantially vertically aligned, and wherein: the computing tile includes an input/output (I/O) interface, a memory interface, a scratch memory, interconnects, and at least a computing element selected from a processor core, a configurable spatial array (CSA), an application specific integrated circuit (ASIC), a central processing unit (CPU), a processing engine (PE), or a dataflow fabric; the network tile includes a virtual circuit (VC) portal to form a segment of a virtual circuit for a single-hop circuit-switched network to support circuit-switching; or the one or more storage tiles include multiple storage cells.

Example 13 may include the integrated circuit of example 12 and/or some other examples herein, wherein a computing element of the computing tile of a first tile stack of the one or more tile stacks is configured to have memory access to one or more storage cells of one or more storage tiles of a second tile stack, the memory access by the computing element being through a VC portal of the network tile of the first tile stack and a VC portal of the network tile of the second tile stack.

Example 14 may include the integrated circuit of example 12 and/or some other examples herein, wherein a first computing element of the computing tile of a first tile stack of the one or more tile stacks is configured to be coupled through a VC to a second computing element of the computing tile of a second tile stack of the one or more tile stacks, the VC including a first VC portal of the network tile of the first tile stack and a second VC portal of the network tile of the second tile stack.

Example 15 may include the integrated circuit of example 14 and/or some other examples herein, wherein the first computing element is to perform operations related to a first dataflow graph, and the second computing element is to perform operations related to a second dataflow graph, with a node of the first dataflow graph being coupled to a node of the second dataflow graph by an edge.

Example 16 may include a computing system, comprising: a printed circuit board (PCB); a host attached to the PCB; and a semiconductor package including an integrated circuit, wherein the integrated circuit includes: a physical network layer having a first side and a second side opposite to the first side, and including a first set of dies, wherein a die of the first set of dies includes multiple tiles, wherein the physical network layer further includes one or more signal pathways dynamically configurable between multiple pre-defined interconnect topologies for the multiple tiles, where each topology of the multiple pre-defined interconnect topologies corresponds to a communication pattern related to a workload; a physical computing layer having a second set of dies, with at least a die of the second set of dies being adjacent to the first side of the physical network layer or including multiple tiles; and a physical memory layer having a third set of dies, with at least a die of the third set of dies being adjacent to the second side of the physical network layer, wherein at least a die of the third set of dies includes multiple tiles, and a tile of the memory layer includes one or more storage cells; wherein at least a tile in the physical computing layer is further arranged to move data to another tile in the physical computing layer or a storage cell of the physical memory layer through the one or more signal pathways in the physical network layer; and wherein the host and the semiconductor package including the integrated circuit are placed on the PCB, the memory layer of the integrated circuit being closer to a top surface of the PCB than the computing layer of the integrated circuit.

Example 17 may include the computing system of example 16 and/or some other examples herein, wherein the physical network layer includes a super-reticle having multiple dies interconnected by interconnect lines coupling a first device in a first die of the multiple dies to a second device of a second die of the multiple dies, and the physical computing layer or the physical memory layer includes one or more chiplets, a tile of a chiplet of the one or more chiplets is bonded to a tile of a die of the super-reticle for the physical network layer.

Example 18 may include the computing system of example 16 and/or some other examples herein, wherein the physical network layer has multiple tiles organized into a radix 6 array shape with multiple rows, with a tile in a first row having one or more contact points located at a first half of the tile, and a tile in a second row adjacent to the first row having one or more contact points located at a second half of the tile opposite to the first half of the tile, and wherein the physical computing layer or the physical memory layer has multiple tiles organized into a radix 4 array shape in a standard NEWS grid, with one or more contact points of a first tile in the physical network layer being in direct contact with one or more contact points of a second tile of the physical computing layer or the physical memory layer.

Example 19 may include the computing system of example 16 and/or some other examples herein, wherein a tile of the physical computing layer includes an input/output (I/O) interface, a memory interface, a scratch memory, interconnects, or a computing element selected from a processor core, a configurable spatial array (CSA), an application specific integrated circuit (ASIC), a central processing unit (CPU), a processing engine (PE), or a dataflow fabric.

Example 20 may include the computing system of example 19 and/or some other examples herein, wherein the I/O interface of the tile of the physical computing layer includes one or more portals to the physical memory layer, one or more portals to a multi-hop packet switched network of the physical network layer, or one or more portals to a single-hop circuit-switched network of the physical network layer, and wherein the physical network layer includes the multi-hop packet switched network to support packet-switching, and the single-hop circuit-switched network to support circuit-switching.

Example 21 may include the computing system of example 19 and/or some other examples herein, wherein at least a tile of the physical computing layer is arranged to access data stored in the scratch memory of the tile, or a memory bank in the physical memory layer.

Example 22 may include the computing system of example 16 and/or some other examples herein, wherein a tile of the physical network layer includes a message passing storage in a multi-hop packet switched network to support packet-switching, or a virtual circuit (VC) portal to form a segment of a virtual circuit for a single-hop circuit-switched network to be coupled to a storage cell in the physical memory layer or to the computing element of the tile of the physical computing layer.

Example 23 may include an integrated circuit, comprising: one or more tile stacks, wherein a tile stack of the one or more tile stacks includes a computing tile in a physical computing layer, a network tile in a physical network layer, a tile of a control sublayer of a physical memory layer, and one or more storage tiles of one or more storage sublayers of the memory layer, the computing tile, the network tile, the tile of a control sublayer, and the one or more storage tiles are substantially vertically aligned, and wherein: the computing tile includes an input/output (I/O) interface, a memory interface, a scratch memory, interconnects, and at least a computing element selected from a processor core, a configurable spatial array (CSA), an application specific integrated circuit (ASIC), a central processing unit (CPU), a processing engine (PE), or a dataflow fabric; the network tile includes a virtual circuit (VC) portal to form a segment of a virtual circuit for a single-hop circuit-switched network to support circuit-switching; and the one or more storage tiles include multiple storage cells.

Example 24 may include the integrated circuit of example 23 and/or some other examples herein, wherein a computing element of the computing tile of a first tile stack of the one or more tile stacks is configured to have memory access to one or more storage cells of the one or more storage tiles of a second tile stack, the memory access by the computing element being through a VC portal of the network tile of the first tile stack and a VC portal of the network tile of the second tile stack.

Example 25 may include the integrated circuit of example 23 and/or some other examples herein, wherein a first computing element of the computing tile of a first tile stack of the one or more tile stacks is configured to be coupled through a VC to a second computing element of the computing tile of a second tile stack of the one or more tile stacks, the VC including a first VC portal of the network tile of the first tile stack and a second VC portal of the network tile of the second tile stack.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

Although certain embodiments have been illustrated and described herein for purposes of description this application is intended to cover any adaptations or variations of the embodiments discussed herein. Therefore, it is manifestly intended that embodiments described herein be limited only by the claims.

What is claimed is:

1. An integrated circuit (IC) package, comprising:
   a physical network layer having at least a first die containing first one or more tiles and being a part of a super-reticle, wherein the super-reticle includes multiple dies formed on a same substrate;
   a physical computing layer coupled with the physical network layer, and having at least a second die with second one or more tiles; and
   a physical memory layer coupled with the physical network layer, and having at least a third die with one or more storage cells.

2. The IC package of claim 1, wherein at least a tile in the second die of the physical computing layer is arranged to communicate with another tile in the physical computing layer or a storage cell of the physical memory layer through the physical network layer located between the physical computing layer and the physical memory layer.

3. The IC package of claim 1, wherein the super-reticle has the multiple dies interconnected by interconnect lines coupling a first device in a first die of the multiple dies to a second device of a second die of the multiple dies.

4. The IC package of claim 1, wherein a tile in the second die of the physical computing layer is arranged to communicate through one or more signal pathways in the physical network layer, and wherein the one or more signal pathways are dynamically configurable between multiple pre-defined interconnect topologies for multiple tiles, where each topology of the multiple pre-defined interconnect topologies corresponds to a communication pattern related to a workload.

5. The IC package of claim 1, wherein the physical memory layer includes a control logic sublayer, and one or more storage cell sublayers having storage cells, and the physical network layer or the physical computing layer includes one or more sublayers.

6. The IC package of claim 1, wherein the physical network layer includes a multi-hop packet switched network to support packet-switching, or a configurable single-hop circuit-switched network to support circuit-switching.

7. The IC package of claim 1, wherein the physical computing layer or the physical memory layer includes one or more chiplets, and a tile of a chiplet of the one or more chiplets is bonded to a tile of a die of the super-reticle for the physical network layer.

8. The IC package of claim 1, wherein the physical network layer has multiple tiles organized into a radix 6 array shape with multiple rows, with a tile in a first row having one or more contact points located at a first half of the tile, and a tile in a second row adjacent to the first row having one or more contact points located at a second half of the tile opposite to the first half of the tile, and wherein the physical computing layer or the physical memory layer has multiple tiles organized into a radix 4 array shape in a standard north, east, west and south (NEWS) grid, with one or more contact points of a first tile in the physical network layer being in direct contact with one or more contact points of a second tile of the physical computing layer or the physical memory layer.

9. The IC package of claim 1, wherein a tile of the physical computing layer includes an input/output (I/O) interface, a memory interface, a scratch memory, interconnects, or a computing element selected from a processor core, a configurable spatial array (CSA), an application specific integrated circuit (ASIC), a central processing unit (CPU), a processing engine (PE), or a dataflow fabric.

10. The IC package of claim 9, wherein the I/O interface of the tile of the physical computing layer includes one or more portals to the physical memory layer, one or more portals to a multi-hop packet switched network of the physical network layer, or one or more portals to a single-hop circuit-switched network of the physical network layer, and wherein the physical network layer includes the multi-hop packet switched network to support packet-switching, and the single-hop circuit-switched network to support circuit-switching.

11. The IC package of claim 10, wherein at least a tile of the physical computing layer is arranged to access data stored in the scratch memory of the tile, or a memory bank in the physical memory layer.

12. The IC package of claim 10, wherein a tile of the physical network layer includes a message passing storage in the multi-hop packet switched network to support packet-switching, or a virtual circuit (VC) portal to form a segment of a virtual circuit for the single-hop circuit-switched network to be coupled to a storage cell in the physical memory layer or to the computing element of the tile of the physical computing layer.

13. The IC package of claim 1, wherein the IC package includes one or more tile stacks, where a tile stack of the one or more tile stacks includes a computing tile in the physical computing layer, a network tile in the physical network layer, a tile of a control sublayer of the physical memory layer, and one or more storage tiles of one or more storage sublayers of the physical memory layer, the computing tile, the network tile, the tile of the control sublayer, and the one or more storage tiles being substantially vertically aligned, and wherein:

the computing tile includes an input/output (I/O) interface, a memory interface, a scratch memory, interconnects, and at least a computing element selected from a processor core, a configurable spatial array (CSA), an application specific integrated circuit (ASIC), a central processing unit (CPU), a processing engine (PE), or a dataflow fabric;

the network tile includes a virtual circuit (VC) portal to form a segment of a virtual circuit for a single-hop circuit-switched network to support circuit-switching; or the one or more storage tiles include multiple storage cells.

14. The IC package of claim 13, wherein a computing element of the computing tile of a first tile stack of the one or more tile stacks is configured to have memory access to one or more storage cells of one or more storage tiles of a second tile stack, the memory access by the computing element being through a VC portal of the network tile of the first tile stack and a VC portal of the network tile of the second tile stack.

15. The IC package of claim 13, wherein a first computing element of the computing tile of a first tile stack of the one or more tile stacks is configured to be coupled through a VC to a second computing element of the computing tile of a second tile stack of the one or more tile stacks, the VC including a first VC portal of the network tile of the first tile stack and a second VC portal of the network tile of the second tile stack.

16. The IC package of claim 15, wherein the first computing element is to perform operations related to a first dataflow graph, and the second computing element is to perform operations related to a second dataflow graph, with a node of the first dataflow graph being coupled to a node of the second dataflow graph by an edge.

17. A computing system, comprising:
a printed circuit board (PCB);
a host attached to the PCB; and
a semiconductor package including an integrated circuit, wherein the integrated circuit includes:
a physical network layer having at least a first die containing first one or more tiles and being a part of a super-reticle, wherein the super-reticle includes multiple dies formed on a same substrate;
a physical computing layer coupled with the physical network layer, and having at least a second die with second one or more tiles; and a physical memory layer coupled with the physical network layer, and having at least a third die with one or more storage cells; and wherein the host and the semiconductor package including the integrated circuit are placed on the PCB.

18. The computing system of claim 17, wherein the integrated circuit further includes a power delivery layer coupled to the physical network layer, the physical computing layer, or the physical memory layer.

19. The computing system of claim 17, wherein a tile of the physical computing layer includes an input/output (I/O) interface, a memory interface, a scratch memory, interconnects, or a computing element selected from a processor core, a configurable spatial array (CSA), an application specific integrated circuit (ASIC), a central processing unit (CPU), a processing engine (PE), or a dataflow fabric.

20. The computing system of claim 19, wherein the I/O interface of the tile of the physical computing layer includes one or more portals to the physical memory layer, one or more portals to a multi-hop packet switched network of the physical network layer, or one or more portals to a single-hop circuit-switched network of the physical network layer, and wherein the physical network layer includes the multi-hop packet switched network to support packet-switching, and the single-hop circuit-switched network to support circuit-switching.

21. The computing system of claim 19, wherein at least a tile of the physical computing layer is arranged to access data stored in the scratch memory of the tile, or a memory bank in the physical memory layer.

22. The computing system of claim 19, wherein a tile of the physical network layer includes a message passing storage in a multi-hop packet switched network to support packet-switching, or a virtual circuit (VC) portal to form a segment of a virtual circuit for a single-hop circuit-switched network to be coupled to a storage cell in the physical memory layer or to the computing element of the tile of the physical computing layer.

23. An integrated circuit, comprising:
one or more tile stacks, wherein a tile stack of the one or more tile stacks includes a computing tile in a physical computing layer, a network tile in a physical network layer, a tile of a control sublayer of a physical memory layer, and one or more storage tiles of one or more storage sublayers of the physical memory layer, wherein the computing tile, the network tile, the tile of the control sublayer, and the one or more storage tiles are substantially vertically aligned, wherein the network tile is within a die of a super-reticle in the physical network layer, the super-reticle includes multiple dies, and wherein the die includes multiple tiles.

24. The integrated circuit of claim 23, wherein:
the computing tile includes an input/output (I/O) interface, a memory interface, a scratch memory, interconnects, and at least a computing element selected from a processor core, a configurable spatial array (CSA), an application specific integrated circuit (ASIC), a central processing unit (CPU), a processing engine (PE), or a dataflow fabric;

the network tile includes a virtual circuit (VC) portal to form a segment of a virtual circuit for a single-hop circuit-switched network to support circuit-switching; and the one or more storage tiles include multiple storage cells.

25. The integrated circuit of claim 23, wherein a computing element of the computing tile of a first tile stack of the one or more tile stacks is configured to have memory access to one or more storage cells of the one or more storage tiles of a second tile stack, the memory access by the computing element being through a VC portal of the network tile of the first tile stack and a VC portal of the network tile of the second tile stack.

* * * * *